(12) United States Patent
Crawford et al.

(10) Patent No.: US 11,705,690 B2
(45) Date of Patent: Jul. 18, 2023

(54) DUAL JUNCTION FIBER-COUPLED LASER DIODE AND RELATED METHODS

(71) Applicant: LEONARDO ELECTRONICS US INC., Tucson, AZ (US)

(72) Inventors: Devin Earl Crawford, Holzkirchen (DE); Prabhu Thiagarajan, Tucson, AZ (US); Mark McElhinney, Marana, AZ (US)

(73) Assignee: LEONARDO ELECTRONICS US INC., Tucson, AZ (US)

( * ) Notice: Subject to any disclaimer, the term of this patent is extended or adjusted under 35 U.S.C. 154(b) by 185 days.

(21) Appl. No.: 17/318,907

(22) Filed: May 12, 2021

(65) Prior Publication Data

US 2021/0265810 A1  Aug. 26, 2021

Related U.S. Application Data

(62) Division of application No. 15/363,874, filed on Nov. 29, 2016, now Pat. No. 11,025,031.

(51) Int. Cl.
*H01S 5/02253* (2021.01)
*H01S 5/40* (2006.01)
*H01S 5/02251* (2021.01)
*H01S 5/10* (2021.01)
*H01S 5/30* (2006.01)
(Continued)

(52) U.S. Cl.
CPC ...... *H01S 5/02253* (2021.01); *H01S 5/02251* (2021.01); *H01S 5/1028* (2013.01); *H01S 5/305* (2013.01); *H01S 5/3095* (2013.01); *H01S 5/34* (2013.01); *H01S 5/4043* (2013.01); *H01S 5/005* (2013.01); *H01S 5/0655* (2013.01); *H01S 5/2063* (2013.01); *H01S 5/22* (2013.01); *H01S 5/2214* (2013.01); *H01S 5/3211* (2013.01)

(58) Field of Classification Search
CPC ........................................... H01S 5/40
See application file for complete search history.

(56) References Cited

U.S. PATENT DOCUMENTS

| 3,711,939 A | 1/1973 | Stoll ........................ 228/246 |
| 3,805,375 A | 4/1974 | LaCombe et al. ............ 29/832 |

(Continued)

FOREIGN PATENT DOCUMENTS

| CA | 2 208 370 C | 7/2005 |
| DE | 968430 | 2/1958 |

(Continued)

OTHER PUBLICATIONS

Chinese Official Action issued in related Chinese Patent Application Serial No. 201780073945.8, dated Sep. 21, 2020 (16 pages) with translation.

(Continued)

*Primary Examiner* — Tuan N Nguyen
(74) *Attorney, Agent, or Firm* — Hayes Soloway P.C.

(57) ABSTRACT

A laser diode apparatus has a first waveguide layer including a gain region connected in series with a second waveguide layer with a second gain region. A tunnel junction is positioned between the first and second guide layers. A single collimator is positioned in an output path of laser beams emitted from the first and second waveguide layers. The optical beam from the single collimator may be coupled into an optical fiber.

9 Claims, 11 Drawing Sheets

(51) Int. Cl.
  H01S 5/34    (2006.01)
  H01S 5/32    (2006.01)
  H01S 5/20    (2006.01)
  H01S 5/00    (2006.01)
  H01S 5/065   (2006.01)
  H01S 5/22    (2006.01)

(56) References Cited

U.S. PATENT DOCUMENTS

| | | | |
|---|---|---|---|
| 3,936,322 A | 2/1976 | Blum et al. | 148/1.5 |
| 4,092,614 A | 5/1978 | Sakuma et al. | |
| 4,156,879 A | 5/1979 | Lee | 357/22 |
| 4,306,278 A | 12/1981 | Fulton et al. | 362/259 |
| 4,653,056 A | 3/1987 | Baer et al. | |
| 4,767,674 A | 8/1988 | Shirai | 257/E23.006 |
| 4,803,691 A | 2/1989 | Scifres et al. | 372/150 |
| 4,813,762 A | 3/1989 | Leger | H01S 5/4062 |
| 4,881,237 A | 11/1989 | Donnelly | |
| 4,903,274 A | 2/1990 | Taneya et al. | |
| 4,947,401 A | 8/1990 | Hinata et al. | |
| 4,980,893 A | 12/1990 | Thornton et al. | |
| 4,993,148 A | 2/1991 | Adachi | 174/252 |
| 5,008,737 A | 4/1991 | Burnham et al. | 357/81 |
| 5,031,187 A | 7/1991 | Orenstein et al. | |
| 5,040,187 A | 8/1991 | Karpinski | |
| 5,045,972 A | 9/1991 | Supan | C22C 26/00 |
| 5,060,237 A | 10/1991 | Peterson | |
| 5,061,974 A | 10/1991 | Onodera et al. | |
| 5,099,488 A | 3/1992 | Ahrabi et al. | |
| 5,102,825 A | 4/1992 | Brennan et al. | 437/129 |
| 5,105,429 A | 4/1992 | Mundinger et al. | |
| 5,105,430 A | 4/1992 | Mundinger et al. | |
| 5,128,951 A | 7/1992 | Karpinski | |
| 5,166,761 A * | 11/1992 | Olson | H01L 31/0725 257/97 |
| 5,202,706 A | 4/1993 | Hasegawa | 359/819 |
| 5,212,706 A | 5/1993 | Jain | |
| 5,212,707 A | 5/1993 | Heidel et al. | |
| 5,253,260 A | 10/1993 | Palombo | 372/34 |
| 5,284,790 A | 2/1994 | Karpinski | |
| 5,298,762 A | 3/1994 | Ou | 257/13 |
| 5,305,344 A | 4/1994 | Patel | |
| 5,311,530 A | 5/1994 | Wagner et al. | 372/36 |
| 5,311,535 A | 5/1994 | Karpinski | |
| 5,325,384 A | 6/1994 | Herb et al. | |
| 5,394,426 A | 2/1995 | Joslin | |
| 5,418,799 A | 5/1995 | Tada | |
| 5,440,577 A | 8/1995 | Tucker | |
| 5,450,430 A | 9/1995 | Chang | 372/38 |
| 5,455,738 A | 10/1995 | Montesano et al. | 361/707 |
| 5,497,391 A | 3/1996 | Paoli | |
| 5,504,767 A | 4/1996 | Jamison et al. | |
| 5,521,931 A | 5/1996 | Biegelsen et al. | 372/36 |
| 5,526,373 A | 6/1996 | Karpinski | |
| 5,568,498 A | 10/1996 | Nilsson | |
| 5,593,815 A | 1/1997 | Ahn | 430/321 |
| 5,627,850 A | 5/1997 | Irwin et al. | |
| 5,644,586 A | 7/1997 | Kawano et al. | |
| 5,679,963 A | 10/1997 | Klem et al. | 257/46 |
| 5,764,675 A | 6/1998 | Juhala | |
| 5,778,020 A | 7/1998 | Gokay | |
| 5,783,316 A | 7/1998 | Colella et al. | |
| 5,812,573 A | 9/1998 | Shiomi et al. | |
| 5,835,515 A | 11/1998 | Huang | |
| 5,835,518 A | 11/1998 | Mundinger et al. | 372/50 |
| 5,848,083 A | 12/1998 | Haden et al. | 372/36 |
| 5,856,990 A | 1/1999 | Nilsson | 359/344 |
| 5,909,458 A | 6/1999 | Freitas et al. | 372/36 |
| 5,913,108 A | 6/1999 | Stephens et al. | |
| 5,923,692 A | 7/1999 | Staskus et al. | |
| 5,930,279 A | 7/1999 | Apollonov et al. | 372/50 |
| 5,987,045 A | 11/1999 | Albares | 372/38 |
| 6,031,285 A | 2/2000 | Nishibayashi | |
| 6,101,208 A | 8/2000 | Gokay | |
| 6,208,677 B1 | 3/2001 | Moyer | 372/66 |
| 6,252,179 B1 | 6/2001 | Lauffer et al. | 174/263 |
| 6,281,471 B1 | 8/2001 | Smart | 219/121.62 |
| 6,295,307 B1 | 9/2001 | Hoden et al. | 372/36 |
| 6,352,873 B1 | 3/2002 | Hoden | 438/28 |
| 6,396,857 B1 | 5/2002 | Labranche | |
| 6,424,667 B1 | 7/2002 | Endriz et al. | |
| 6,480,514 B1 | 11/2002 | Lorenzen et al. | 372/35 |
| 6,493,373 B1 | 12/2002 | Boucart | 257/33.069 |
| 6,535,533 B2 | 3/2003 | Lorenzen et al. | 372/34 |
| 6,535,541 B1 | 3/2003 | Boucart et al. | 372/96 |
| 6,542,531 B2 | 4/2003 | Sirbu | B82Y 20/00 |
| 6,727,117 B1 | 4/2004 | McCoy | |
| 6,865,200 B2 | 3/2005 | Takigawa et al. | |
| 7,016,383 B2 | 3/2006 | Rice | |
| 7,286,359 B2 | 10/2007 | Khbeis et al. | |
| 7,359,413 B2 | 4/2008 | Tzuk et al. | 372/34 |
| 7,529,286 B2 | 5/2009 | Gokay et al. | 372/69 |
| 7,580,189 B2 | 8/2009 | Urey | G02B 3/0062 |
| 7,660,335 B2 | 2/2010 | Thiagarajan et al. | 372/34 |
| 7,864,825 B2 | 1/2011 | Thiagarajan et al. | 372/36 |
| 7,944,955 B2 | 5/2011 | Thiagarajan et al. | 372/34 |
| 8,017,935 B2 | 9/2011 | Staszewski et al. | 257/27 |
| 8,653,550 B2 | 2/2014 | Mastro | H01L 33/40 |
| 8,664,524 B2 | 3/2014 | Gamett | H01L 31/02966 |
| 8,848,753 B2 | 9/2014 | Koenning | 372/29.021 |
| 9,256,073 B2 | 2/2016 | Chann | G02B 5/18 |
| 10,120,149 B1 | 11/2018 | Mathai | G02B 6/425 |
| 2001/0017870 A1 | 8/2001 | Hayakawa | 372/40 |
| 2002/0001864 A1 | 1/2002 | Ishikawa et al. | |
| 2002/0009106 A1 | 1/2002 | Miyokawa et al. | |
| 2002/0014631 A1 | 2/2002 | Iwata | 257/89 |
| 2002/0025096 A1 | 2/2002 | Wang et al. | 385/8 |
| 2002/0086483 A1 | 7/2002 | Kim | 438/264 |
| 2002/0086486 A1 | 7/2002 | Tanaka | H01L 21/28518 |
| 2003/0116767 A1 | 6/2003 | Kneissl et al. | 257/79 |
| 2004/0037340 A1 | 2/2004 | Yanagisawa | |
| 2004/0052280 A1 | 3/2004 | Rice | |
| 2004/0082112 A1 | 4/2004 | Stephens | |
| 2004/0125459 A1 | 7/2004 | Tanitsu et al. | 359/619 |
| 2004/0264521 A1 | 12/2004 | Ness et al. | |
| 2005/0087849 A1 | 4/2005 | Morita | H01L 24/48 |
| 2005/0095755 A1 | 5/2005 | Nakata et al. | |
| 2005/0232628 A1 | 10/2005 | Von Freyhold et al. | 398/41 |
| 2005/0254539 A1 | 11/2005 | Klimek | |
| 2006/0011938 A1 | 1/2006 | Debray | 257/104 |
| 2006/0197100 A1 | 9/2006 | Shen | 257/94 |
| 2007/0116079 A1 | 5/2007 | Giniunas et al. | 372/69 |
| 2007/0273957 A1 | 11/2007 | Zalevsky | G02B 27/1093 |
| 2008/0089380 A1 * | 4/2008 | Konig | H01S 5/4043 372/75 |
| 2008/0123710 A1 | 5/2008 | Brick | B82Y 20/00 |
| 2008/0130223 A1 | 6/2008 | Nakamura | H02M 7/003 |
| 2008/0213710 A1 | 9/2008 | Schultz | F23N 1/027 |
| 2008/0259983 A1 | 10/2008 | Trococoli | 372/6 |
| 2009/0015185 A1 | 1/2009 | Yoshida | 318/504 |
| 2009/0090932 A1 | 4/2009 | Bour et al. | 257/103 |
| 2010/0012188 A1 | 1/2010 | Garnett | 136/260 |
| 2011/0051759 A1 | 3/2011 | Telford | 372/35 |
| 2011/0103409 A1 | 5/2011 | Sipes | G02B 6/4296 |
| 2011/0241549 A1 | 10/2011 | Wootton | 315/117 |
| 2011/0280269 A1 | 11/2011 | Ghang-Hasnain | H01S 5/105 |
| 2012/0043875 A1 | 2/2012 | Seo | H01L 23/3677 |
| 2012/0114001 A1 | 5/2012 | Fang et al. | 372/45.01 |
| 2012/0153254 A1 | 6/2012 | Mastro | 257/13 |
| 2012/0252144 A1 | 10/2012 | Schroeder et al. | 438/26 |
| 2012/0287958 A1 | 11/2012 | Lell | H01S 5/323 |
| 2013/0016752 A1 | 1/2013 | Lell | H01S 5/323 |
| 2013/0112667 A1 | 5/2013 | Holmgren | G02B 27/0961 |
| 2013/0259074 A1 | 10/2013 | Newman | H01S 3/04 |
| 2013/0271959 A1 | 10/2013 | Woodgate | G09F 13/04 |
| 2014/0084452 A1 | 3/2014 | Nagamatsu | H01L 21/561 |
| 2014/0293554 A1 | 10/2014 | Shashkov | 361/748 |
| 2015/0063387 A1 | 3/2015 | Joseph et al. | H01S 5/02438 |
| 2015/0162478 A1 | 6/2015 | Fafard | 257/461 |
| 2015/0207011 A1 | 7/2015 | Gamett | H01L 31/0368 |
| 2015/0207294 A1 | 7/2015 | Brick et al. | H01S 5/10 |
| 2015/0255960 A1 | 9/2015 | Kanskar | H01S 5/4075 |
| 2016/0014878 A1 | 1/2016 | Kilkenny | 257/99 |
| 2016/0147025 A1 | 5/2016 | Sakamoto | G02B 27/0905 |

(56) References Cited

U.S. PATENT DOCUMENTS

| | | | | |
|---|---|---|---|---|
| 2016/0192473 | A1 | 6/2016 | Kasashima | 174/251 |
| 2016/0366757 | A1 | 12/2016 | Kobayashi | H05K 1/0204 |
| 2017/0051884 | A1 | 2/2017 | Raring | |
| 2017/0288367 | A1 | 10/2017 | Tanigucki | |
| 2017/0338194 | A1 | 11/2017 | Gittemeier | |
| 2018/0152000 | A1 | 5/2018 | Crawford et al. | H01S 5/02288 |
| 2018/0254606 | A1 | 9/2018 | McElkinney et al. | H01S 5/02484 |
| 2018/0261975 | A1 | 9/2018 | Pavlov | |
| 2018/0335582 | A1 | 11/2018 | Ishige | |
| 2018/0337513 | A1 | 11/2018 | Crawford et al. | H01S 5/3095 |
| 2020/0027839 | A1 | 1/2020 | Hino | H01L 23/49 |
| 2020/0028332 | A1 | 1/2020 | Kobayaski | G02B 3/06 |
| 2020/0075529 | A1 | 3/2020 | Otsuka | |

FOREIGN PATENT DOCUMENTS

| | | | |
|---|---|---|---|
| DE | 19518177 | 11/1996 | H01S 3/0941 |
| DE | 10062579 | 6/2001 | |
| DE | 102008040374 | 1/2010 | H01S 5/40 |
| EP | 1439618 | 7/2004 | H01S 5/024 |
| EP | 1452614 | 9/2004 | H01S 5/024 |
| EP | 1811617 | 7/2007 | H01S 5/024 |
| EP | 1887666 | 2/2008 | H01S 5/024 |
| EP | 2110903 | 10/2009 | H01S 5/00 |
| EP | 2305400 | 4/2011 | B22D 19/00 |
| JP | 2002111058 | 4/2002 | H01L 33/00 |

OTHER PUBLICATIONS

Official Action issued in Applicants' corresponding EPO Application Serial No. 07117048.7-2222, dated Aug. 6, 2009, 4 pages.
Official Action issued in Applicants' corresponding EPO Application Serial No. 07117048.7-2222, dated Nov. 20, 2008, 9 pages.
Intention to Grant issued in Applicants' corresponding EPO Application Serial No. 09157643.9, dated Apr. 7, 2017, 6 pages.
Official Action issued in Applicants' corresponding EPO Application Serial No. 09157643.9, dated Aug. 22, 2016, 5 pages.
Official Action issued in Applicants' corresponding EPO Application Serial No. 09157643.9, dated Apr. 16, 2014, 2 pages.
European Search Report issued in application No. 09157643.9, dated Aug. 9, 2013 (7 pgs).
European Search Report issued in application No. 20150730.8, dated Jul. 3, 2020 (8 pgs).
Intention to Grant issued in Applicants' corresponding EPO Application Serial No. 16172620.3, dated Jul. 19, 2019, 3 pages.
European Search Report issued in application No. 18173282.7-1211, dated Oct. 8, 2018 (8 pgs).
European Search Report issued in application No. 18173282.7-1211, dated May 20, 2021 (6 pgs).
Intention to Grant issued in Applicants' corresponding EPO Application Serial No. 06845311.7, dated Nov. 9, 2010, 5 pages.
European Search Report issued in application No. 06845311.7, dated Mar. 31, 2010 (9 pgs).
Official Action issued in European application No. 18173282.7-1211, dated Jan. 23, 2020 (6 pgs).
European Search Report issued in application No. 16172620.3, dated Oct. 25, 2016 (9 pgs).
European Supplemental Search Report issued in related European Patent Application 17875888.4, dated Jul. 9, 2020 (11 pages).
European Supplemental Search Report issued in related European Patent Application 20196466.5, dated Feb. 16, 2021 (7 pages).
Feng, et al., "High efficient GaN-based laser diodes with tunnel junction", Applied Physics Letters 103, AIP Publishing, LLC, 2013.
Rieprich, et al., "Proceedings of SPIE—Assessment of factors regulating the thermal lens profile and lateral brightness in high power diode lasers", SPIEL ASE, 2017.
Office Action issued in U.S. Appl. No. 15/363,874, dated Jul. 18, 2019 (24 pgs).
Office Action issued in U.S. Appl. No. 15/363,874, dated Apr. 24, 2018 (10 pgs).
Office Action issued in U.S. Appl. No. 15/363,874, dated Feb. 14, 2019 (13 pgs).
Office Action issued in U.S. Appl. No. 15/363,874, dated Mar. 6, 2020 (12 pgs).
Office Action issued in U.S. Appl. No. 15/363,874, dated Jun. 15, 2020 (12 pgs).
Office Action issued in U.S. Appl. No. 15/363,874, dated Oct. 14, 2020 (11 pgs).
Office Action issued in U.S. Appl. No. 15/363,874, dated Oct. 4, 2018 (14 pgs).
Notice of Allowance issued in U.S. Appl. No. 15/363,874, dated Feb. 2, 2021 (7 pgs).
Office Action issued in U.S. Appl. No. 14/728,923, dated Aug. 9, 2018 (17 pgs).
Office Action issued in U.S. Appl. No. 14/728,923, dated Apr. 19, 2018 (16 pgs).
Office Action issued in U.S. Appl. No. 14/728,923, dated Oct. 2, 2017 (11 pgs).
Office Action issued in U.S. Appl. No. 12/105,126, dated Jul. 23, 2009 (7 pgs).
Office Action issued in U.S. Appl. No. 12/105,126, dated Apr. 24, 2009 (8 pgs).
Notice of Allowance issued in U.S. Appl. No. 12/105,126, dated Sep. 22, 2009 (7 pgs).
Notice of Allowance issued in U.S. Appl. No. 12/648,141, dated Jan. 11, 2011 (11 pgs).
Office Action issued in U.S. Appl. No. 16/539,889, dated Feb. 1, 2021 (18 pgs).
Office Action issued in U.S. Appl. No. 16/539,889, dated Oct. 21, 2020 (16 pgs).
Office Action issued in U.S. Appl. No. 16/539,889, dated Jul. 1, 2020 (19 pgs).
Office Action issued in U.S. Appl. No. 11/299,029, dated Aug. 22, 2008 (8 pgs).
Office Action issued in U.S. Appl. No. 16/540,961, dated Nov. 17, 2020 (13 pgs).
Office Action issued in U.S. Appl. No. 16/540,961, dated Aug. 5, 2020 (9 pgs).
Office Action issued in U.S. Appl. No. 11/829,030, dated Nov. 30, 2009 (16 pgs).
Office Action issued in U.S. Appl. No. 11/829,030, dated Jun. 24, 2009 (13 pgs).
Office Action issued in U.S. Appl. No. 11/829,030, dated Apr. 3, 2009 (13 pgs).
Office Action issued in U.S. Appl. No. 11/829,030, dated Nov. 12, 2008 (12 pgs).
Office Action issued in U.S. Appl. No. 16/895,961, dated Dec. 10, 2021 (39 pgs).
Notice of Allowance issued in U.S. Appl. No. 11/829,030, dated Aug. 30, 2010 (7 pgs).
Notice of Allowance issued in U.S. Appl. No. 16/734,133, dated Dec. 3, 2021 (9 pgs).
Giri et al, "Influence of Hot Electron Scattering and Electron-Phonon Interactions on Thermal Boundary Conductance at Metal/Nonmetal Interfaces" Journal of Heat Transfer, vol. 136, dated Sep. 2014 (6 pgs).
Martin et al., "Thermal Behavior of Visible AlGaInP—GaInP Ridge Laser Diodes" IEEE Journal of Quantum Electronics, vol. 28, No. 11, dated Nov. 1992 (7 pgs).
Monachon, C., "Thermal Boundary Conductance Between Metals and Dielectrics" thesis for the graduation of Doctor of Science, Federal Institute of Technology in Lausanne, 2013 (251 pgs).
Nekorkin et al., "Nonlinear mode mixing in dual-wavelength semiconductor lasers with tunnel junctions", Applied Physics Letters 90, 171106 (2007) (3 pgs).
Notice of Allowance issued in U.S. Appl. No. 15/601,820, dated Jun. 11, 2019 (8 pgs).
Rieprich et al., "Assessment of Factors Regulating the Thermal Lens Profile and Lateral Brightness in High Power Diode Lasers" Proc of SPIE, vol. 10085, No. 1008502-1, dated 2017 (10 pgs).

(56) References Cited

OTHER PUBLICATIONS

Zhang et al., "Thermal Transport Across Metal-Insulator Interface Via Electron-Phonon Interaction," Journal of Physics Condensed Matter, dated Oct. 2013 (15 pgs).
International Preliminary Report on Patentability issued in application No. PCT/US2017/057209, dated Jun. 4, 2019 (8 pgs).
International Search Report and Written Opinion issued in corresponding PCT Patent Appln. Serial No. PCT/US17/57209 dated Jan. 16, 2018, 10 pgs.
International Search Report and Written Opinion issued in corresponding PCT Patent Appln. Serial No. PCT/US19/46410 dated Nov. 8, 2019, 7 pgs.
Office Action issued in U.S. Appl. No. 15/601,820, dated Feb. 27, 2019 (26 pages).
Office Action issued in U.S. Appl. No. 15/601,820, dated Aug. 27, 2018 (28 pages).
Yonkee, B.P., et al., "Demonstration of a III-nitride edge-emitting laser diode utilizing a GaN tunnel junction contact", Optics Express, vol. 24, No. 7, pp. 7816-7822, Apr. 2016.
Young, Lee W., Authorized officer, International Searching Authority, Written Opinion of the International Searching Authority, International Patent Application Serial No. PCT/US06/47448, completion date: Oct. 30, 2008.
Young, Lee W., Authorized officer, International Searching Authority, International Search Report, International Patent Application Serial No. PCT/US06/47448, dated Nov. 1, 2008.
Polyimide properties data sheet, www.mit.edu, Oct. 27, 2004 (Year 2004).
RO30000 Series Laminates, Rogers Corporation Data sheet (year 2020).
Sunstone, FR-4 PCB Material, Mar. 14, 2017 (Year 2017).
Chen et al., High-T Polymer Dec. 25, 2017 (Year 2017).
Robin K. Huang, Bien Chann, James Burgess, Michael Kaiman, Robert Overman, John D. Glenn, and Parviz Tayebati "Direct diode lasers with comparable beam quality to fiber, CO2, and solid state lasers", Proc. SPIE 8241, High-Power Diode Laser Technology and Applications X, 824102 (Feb. 8, 2012); https://doi.org/10.1117/12.907161 (abstract only).
Official Action issued in corresponding U.S. Appl. No. 16/539,889, dated May 11, 2021, 21 pages.
Official Action issued in corresponding U.S. Appl. No. 16/539,889, dated Aug. 25, 2021, 25 pages.
Official Action issued in corresponding U.S. Appl. No. 16/539,889, dated Dec. 8, 2021, 19 pages.
International Preliminary Report on Patentability issued in International Application Serial No. PCT/US2019/046410, dated Feb. 16, 2021, 6 pages.
Watson, Edward, Walter Whitaker, Christopher Brewer, and Scott Harris "Implementing Optical Phased Array Beam Steering with Cascaded Microlens Arrays" IEEE Proceedings, IEEE Aerospace Conference; Mar. 9-16, 2002 (Year: 2002).

\* cited by examiner

DUAL JUNCTION FIBER-COUPLED LASER DIODE AND RELATED METHODS

CROSS REFERENCE TO RELATED APPLICATION

The present application is a divisional of co-pending U.S. application Ser. No. 15/363,874, filed Nov. 29, 2016, the contents of which are incorporated herein by reference.

FIELD OF THE DISCLOSURE

The present disclosure is generally related to laser diodes and more particularly is related to a dual junction fiber-coupled laser diode and related methods

BACKGROUND OF THE DISCLOSURE

Laser diodes provide inexpensive, reliable sources of high brightness optical power over a broad spectral range. Many applications require that the light be coupled into a fiber to transport the light from the source to the target application. Emission from laser diodes, in particular from edge-emitting laser diodes is inherently difficult to couple into a fiber due to astigmatism, very high elliptical aspect ratio and the difficulty in controlling the phase front of emitted light.

Several patents and publications have been directed to improving the ability to couple edge-emitting laser diodes. See, for example, U.S. Pat. Nos. 5,212,706A, 5,202,706, 5,679,963A, 6,535,541, and 8,848,753. For example, some patents have described the use of the tunnel junction in edge emitting laser diodes to increase the stacking density of laser diodes by incorporating multiple emitters in a single epitaxial structure. The use of edge emitters with multiple, separate beams, each lasing at different wavelengths has also been described. This approach may enable very compact vertical stacking as well as emission of multiple wavelengths from a single chip.

Edge-emitting short wavelength III-nitride based laser diodes pose unique challenges due to the difficulty of activating Mg acceptors in p-type MOCVD grown GaN. A solution to this challenge has been described in which a tunnel junction was used along with multiple epitaxial growth steps to improve activation of Mg-doped nitrides.

Spatial combining techniques may be used to couple the emission from multiple laser diodes into a single optical fiber. Spatial combining generally requires alignment of multiple optical components such as lenses, reflectors and prisms. U.S. Pat. No. 8,848,753 B2 describes a technique that improves coupling in a compact form factor using a spatial combining technique to reduce sensitivity to mechanical tolerances on the mounting baseplate while compensating mechanical misalignment with careful optical alignment of prisms to couple light into a fiber.

FIG. 1 is a schematic diagram of an edge emitting laser diode 1 representative of the current state of the art, in accordance with the prior art. The laser diode 1 is comprised of an electrical contact 10 that is used to inject electrical current into the epitaxial layers 12 at the heavily doped p-type cap layer 13. The current flows through the p-type cap layer 13 into a top p-doped cladding layer 14 that has a lower optical refractive index than the adjacent guiding layers 15, 17. Current passes through the guide layer 15 into the active layer 16 causing the optical gain that is responsible for stimulated emission, and hence the laser operation. The guiding layers 15, 17 are typically undoped or lightly doped and form a thin layer that guides optical power along the length of the laser cavity. The active layer 16 or gain medium provides the optical gain responsible for stimulated emission and hence lasing. Carriers (electrons) injected from the bottom contact 21 similarly pass through the substrate 20, a buffer layer 19, a lower cladding layer 18, and into the active region. The lasing mechanism can be easily understood as the conversion of carriers from one type, for example a "hole" to the other type "electron" via recombination by stimulated emission. The buffer layer 19 is typically grown on top of the substrate 20 in order to improve the crystal quality in the laser and reduce the concentration of impurities.

Efficient operation of the laser diode 1 requires that optical power be confined in both the vertical and lateral dimensions. Vertical guiding may be achieved by sandwiching the active and guide layers 15, 16, 17 between cladding layers 14, 18 having lower refractive index than the guide layers 15, 17. Lateral guiding, or optical confinement, results from the lateral confinement of injected carriers (i.e. gain guiding) and also from the shape of the ridge 22. Hence, the lateral waveguide is directly linked to the current injection by the shape of the ridge 22.

The total thickness of the vertical waveguide may be defined by the thickness of the guide and active layers 15, 16, and 17. This thickness is dictated by appropriate trade-offs between conflicting requirements of the laser diode operation and performance. The total series resistance of the laser diode 1 must be kept as low as possible since Ohmic loss is a major source of heating inside the laser diode 1 which degrades performance and is a major factor limiting maximum emitted optical power. The resistance is reduced by increasing conductivity in the clad layers 14, 18 by incorporating small amounts of impurities (dopants) in these layers. The guide layers 15, 17 are nominally undoped (intrinsic) or only lightly doped near the guide/clad interface since Ohmic loss does not occur near the p-n interface because carrier transport in this region is driven by the carrier density gradient (diffusion) rather than by the electric field (drift).

FIG. 2 is a schematic diagram of the edge emitting laser diode 1 of FIG. 1 and corresponding refractive index and optical intensity graph 2, in accordance with the prior art. Specifically, the graph 2 of FIG. 2 shows the refractive index 25 and optical intensity 26 along the growth direction 41 of the laser diode 1, e.g., showing the optical intensity 26 profile along the direction of current flow (aligned with growth direction 41) with the p-type contact located along the left side of the laser diode 1. The overlap between the optical intensity 26 and the electrically conducting cladding layers 14, 18 leads to loss due to absorption by free carriers. The free carrier absorption is therefore mitigated by moving the doping as far away from the optical mode as possible. However, moving the dopant barriers further away from the intrinsic region eventually results in increased series resistance. The optimum distance of the dopant barrier from the center of the waveguide is determined by the depletion width of the P-I-N diode structure. The depletion width, in turn, is an inherent property of the semiconductor material. Therefore, the optical intensity profile of the light in the vertical waveguide is determined by this fundamental material property.

FIG. 3 is a schematic diagram of the edge emitting laser diode 1 of FIG. 1 showing the optical intensity of the laser diode 1 at the laser facet 40, in accordance with the prior art. FIG. 3 illustrates the consequences of fundamental issues discussed relative to FIGS. 1-2. Specifically, the width of the optical intensity profile at the laser facet 40 is much smaller in the vertical direction 44 than in the lateral direction 45. The light emitted from the laser diode 1 diverges rapidly in the direction of current flow, aligned with the vertical direction 44 of the laser diode 1, while the divergence in the lateral direction 45 is much smaller. Because of the inherent link between electrical current flow and the optical waveguide, high power laser diodes 1 exhibit very high aspect ratio elliptic near-field intensity at the laser facet. The emitted light is also strongly astigmatic, further complicating the task of coupling the emitted laser light into an optical medium. The axis perpendicular to the direction of current flow, e.g., aligned with the lateral direction 45, is referred to as the slow-axis and the optical near-field can be approximately 100 microns or more wide, while the width of the optical near-field along the fast-axis, e.g., aligned with the vertical direction 44, is on the order of a few microns or less, depending on the emission wavelength. The far-field divergence 43 from the laser is also depicted in FIG. 3, showing the relationship between the dimension of the optical near-field along the slow and fast axes to the optical far field.

As can be seen, the resulting emission from the laser diode 1 is consequently elliptical and astigmatic, which is less than optimal for many applications. For one, the conventional laser diode 1 requires numerous components to collimate the laser emission initially, and additional components to focus the laser emission for a particular application. Additionally, the laser diode 1 can be costly to manufacture both in terms of component or material costs and the processing time associated with manufacture. Another drawback of the conventional art is that the optical density on the front facet of the laser diode for a given output power is concentrated in the vertical direction, which increases the likelihood of failure due to optical mirror damage.

Thus, a heretofore unaddressed need exists in the industry to address the aforementioned deficiencies and inadequacies.

SUMMARY OF THE DISCLOSURE

Embodiments of the present disclosure provide a system and method for a laser diode apparatus. Briefly described, in architecture, one embodiment of the laser diode apparatus, among others, can be implemented as follows. A first waveguide is connected in series with a second waveguide in a single epitaxial structure. A tunnel junction is positioned between the first and second waveguides. A single collimator is positioned in an output path of laser beams emitted from the first and second waveguides.

In one aspect of the apparatus, an optical output of the single collimator is directed into an optical fiber.

In another aspect of the apparatus, a corrective optical assembly is positioned between the single collimator and the optical fiber, wherein the corrective optical assembly receives the optical output of the single collimator and an optical output of the corrective optical assembly is directed into the optical fiber, wherein the corrective optical assembly comprises: a second collimator; a corrective optic device; and a focusing lens.

In yet another aspect of the apparatus, the single collimator is a fast-axis collimator and the second collimator is a slow-axis collimator.

In another aspect of the apparatus, at least one of the first and second waveguides further comprises: first and second cladding layers; first and second guide layers positioned between the first and second cladding layers; and an active layer positioned between the first and second guide layers.

In another aspect of the apparatus, the tunnel junction further comprises first and second heavily doped layers positioned in contact with one another.

In this aspect of the apparatus, each of the first and second heavily doped layers has a thickness dimension of substantially between 10-40 nm.

In this aspect of the apparatus, the first heavily doped layer further comprises a n++ layer and the second heavily doped layer further comprises a p++ doped layer.

In this aspect of the apparatus, a n-type cladding layer of the first waveguide is positioned in contact with the n++ layer and a p-type cladding layer of the second waveguide is positioned in contact with the p++ layer.

The present disclosure can also be viewed as providing a fiber-coupled laser diode device. Briefly described, in architecture, one embodiment of the device, among others, can be implemented as follows. A first guiding layer is connected to a second guiding layer in a single epitaxial structure, wherein each of the first and second guiding layers have an active layer. A tunnel junction is positioned between the first and second guiding layers, wherein the tunnel junction is formed from two thin, heavily doped layers positioned in contact with one another. A common vertical waveguide is shared by the active layers of the first and second guiding layers, wherein the common vertical waveguide is formed from the first guiding layer in contact with one of the two thin, heavily doped layers and the second guiding layer positioned in contact with another of the two thin, heavily doped layers.

In one aspect of the device, the active layer of each of the first and second guide layers further comprises a quantum well active layer.

In another aspect of the device, the two thin, heavily doped layers of the tunnel junction further comprise a n++ layer and a p++ layer, wherein the first guiding layer is a n-guide layer and the second guiding layer is a p-guide layer.

In another aspect of the device, the first guiding layer further comprises an undoped guide layer and a n-guide layer positioned adjacent to the n++ layer, wherein the n-guide layer contacts the n++ layer, and wherein the second guiding layer further comprises an undoped guide layer and a p-guide layer, wherein the p-guide layer contacts the p++ layer.

In yet another aspect of the device, the n-guide layer and the p-guide layer of the first and second guiding layers, respectively, have an optical refractive index equal to or greater than an optical refractive index of the undoped guide layers of the first and second guiding layers.

The present disclosure can also be viewed as providing methods of coupling optical outputs from edge-emitting laser diodes into an optical fiber. In this regard, one embodiment of such a method, among others, can be broadly summarized by the following steps: forming a fiber-coupled laser diode device by connecting a first guiding layer to a second guiding layer in a single epitaxial structure, wherein a tunnel junction is positioned between the first and second guiding layers; emitting optical outputs of first and second guiding layers into a single collimator; and emitting the optical output from the single collimator into an optical fiber.

In another aspect of the method, the optical output of the single collimator is corrected with a corrective optical assembly positioned between the single collimator and the optical fiber, wherein the corrective optical assembly comprises: a second collimator; a corrective optic device; and a focusing lens.

In another aspect of the method, the tunnel junction is formed between the first and second guiding layers from two thin, heavily doped layers positioned in contact with one another.

In yet another aspect of the method, active layers of the first and second guiding layers share a common vertical waveguide formed from the first guiding layer in contact with one of the two thin, heavily doped layers and the second guiding layer positioned in contact with another of the two thin, heavily doped layers.

In another aspect of the method, the first guiding layer further comprises an undoped guide layer and a n-guide layer positioned adjacent to the n++ layer, wherein the n-guide layer contacts the n++ layer, and wherein the second guiding layer further comprises an undoped guide layer and a p-guide layer, wherein the p-guide layer contacts the p++ layer.

In yet another aspect of the method, the n-guide layer and the p-guide layer of the first and second guiding layers, respectively, have an optical refractive index equal to or greater than an optical refractive index of the undoped guide layers of the first and second guiding layers.

In yet another aspect of the disclosure, a lateral gain profile of the active regions to the gain profile of the lateral waveguide may be matched by implanting ions on either side of the lateral waveguide at a depth proximate to the tunnel junction.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

To overcome the deficiencies of the conventional art, the subject disclosure provides devices and methods which utilize a tunnel junction within the epitaxial layers of an edge-emitting laser diode to increase the power coupled from a laser diode or laser diode bar into a single optical fiber with relaxed requirements on external optical components for collimating and focusing the light. Tandem tunnel junctions are commonly used in solar cells, whereby the tunnel junction enables increased efficiency for the conversion of light to electrical energy by providing a means of stacking multiple p-n junctions to collect incident solar power. In accordance with the present disclosure, laser diodes that emit light from one of the contact surfaces through an electrically conducting mirror, known as vertical cavity surface emitting lasers (VCSEL's), can be designed to benefit from tunnel junctions. The tunnel junction provides a means by which multiple gain regions can be incorporated in a single cavity to increase coherent power. While increased fiber coupled power is advantageous for numerous applications, other less apparent advantages result from the novel structures and methods disclosed herein. In one example, the tunnel junction may be comprised of thin, heavily doped p++ and n++ layers between two P-I-N semiconductor diodes to reduce divergence from the diode along the fast-axis, e.g., in the direction of current flow within an edge-emitting laser diode, to improve efficiency of optical coupling into a fiber, and reduce cost of fiber-coupled laser diodes One benefit the subject disclosure may have is using fewer optical components to couple the power into the fiber. Additionally, both part cost and process time associated with optical alignment can be reduced when the optical emission is more symmetric, as discussed in further detail herein. Reliability is also improved when fewer components are required to collimate and focus the emission from the laser diode. The optical density on the front facet of the laser diode is reduced for a given output power because the optical power is spread over a larger area along the vertical (epitaxial growth) direction. Probability of failure due to optical mirror damage is therefore reduced.

Additionally, the subject disclosure can be used to significantly increase the width of the optical intensity at the laser facet along the fast axis, thereby reducing the fast-axis divergence with minimal increase in optical loss. In some examples, the brightness of the emitted optical beam can be nearly doubled relative to a conventional laser diode.

Figure 1:
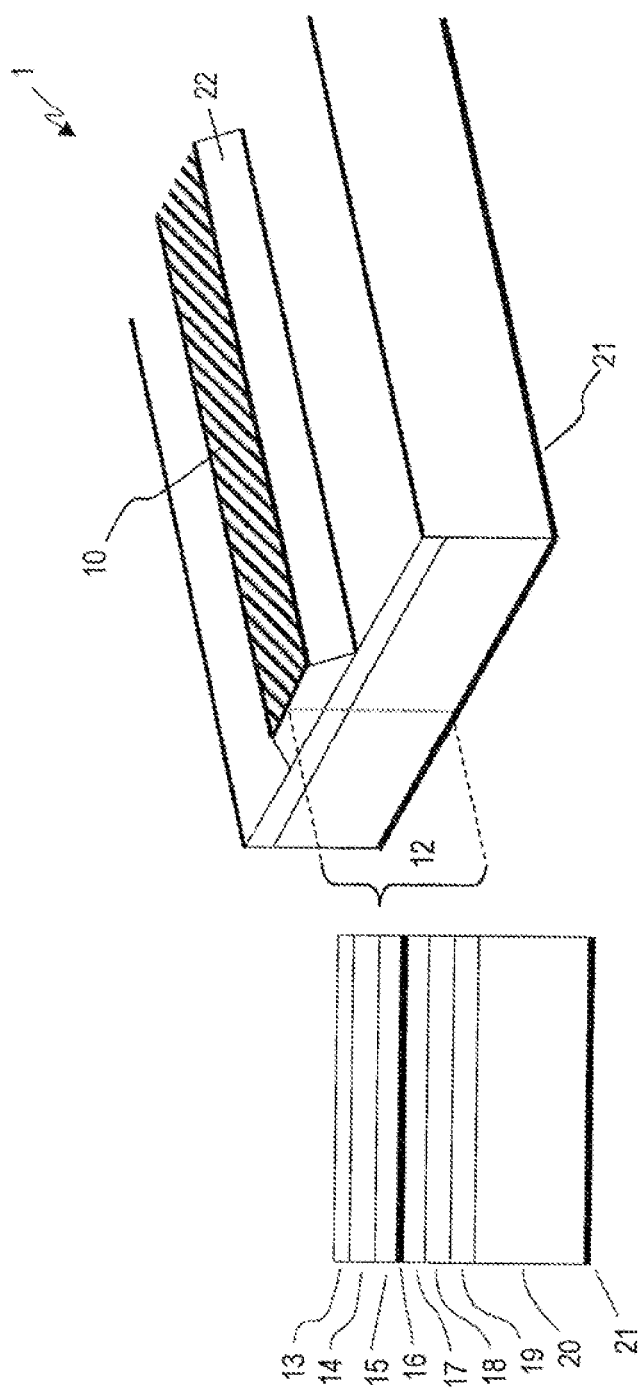
FIG. 1 is a schematic diagram of an edge emitting laser diode representative of the current state of the art, in accordance with the prior art.
Figure 4:
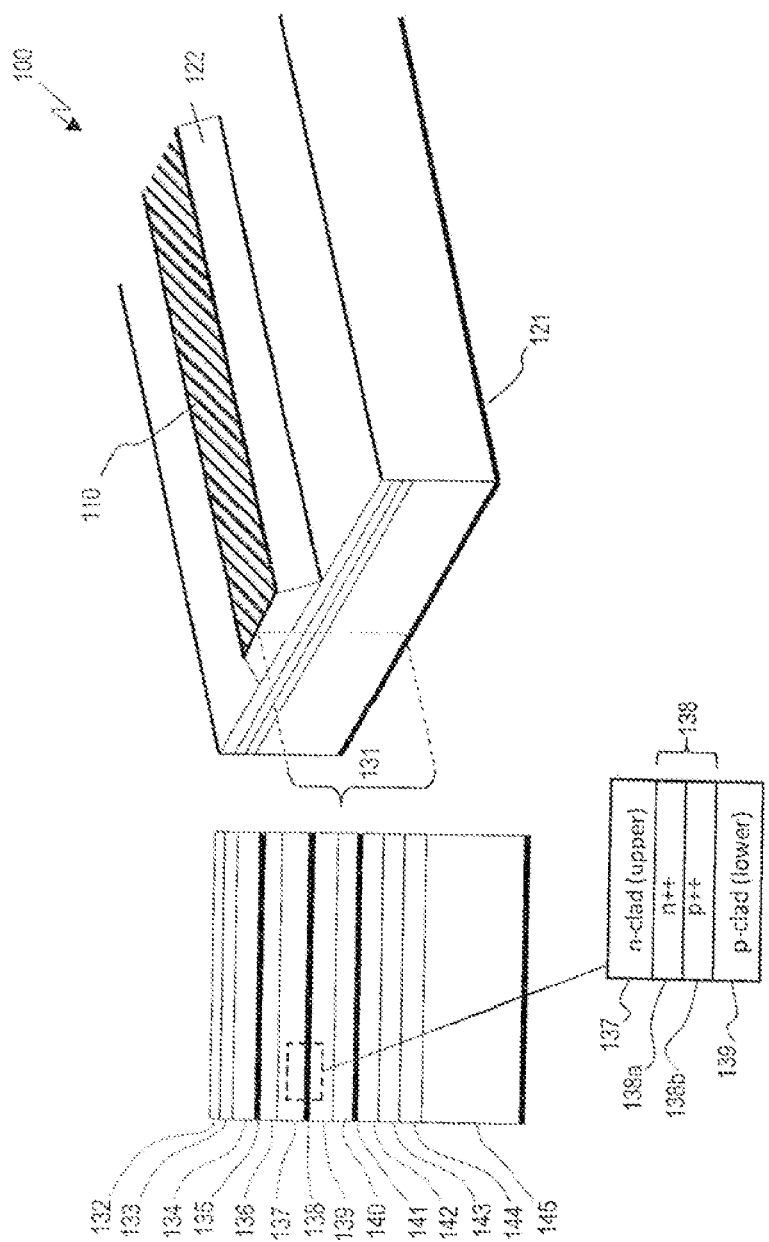
FIG. 4 is a schematic diagram of a coupled laser diode apparatus, in accordance with a first exemplary embodiment of the present disclosure.

FIG. 4 is a schematic diagram of a laser diode apparatus 100, in accordance with a first exemplary embodiment of the present disclosure. Specifically, FIG. 4 illustrates an isometric view and corresponding cross-sectional view diagrams of the laser diode apparatus 100 having two waveguides with respective gain (active) layers 135, 141 connected in series in a single epitaxial structure 131 with a tunnel junction 138 sandwiched between the two waveguides. Here, there are two (or more) waveguides which are uncoupled or operating incoherently. One waveguide, i.e., the top waveguide includes a heavily doped p-type cap layer 132, a p-type clad layer 133, a top waveguide layer 134, a top active region or layer 135 where optical gain occurs, a bottom guide layer 136 in the top waveguide, and a bottom n-type cladding layer 137 for the top waveguide. The other waveguide, i.e., the bottom waveguide includes a p-type cladding layer 139, the top guide layer 140, a bottom active region or layer 141 for optical gain, a bottom waveguide 142, a bottom n-type cladding layer 143. The tunnel junction 138 is positioned between the top and bottom waveguides, such that it is in contact with the bottom n-type cladding layer 137 of the top waveguide and the p-type cladding layer 139 of the bottom waveguide. The laser diode apparatus 100 also includes a buffer layer 144 and the substrate 145. The substrate 144, the bottom contact 121, the top contact 110, and the ridge 122 may be similar to a conventional edge-emitting laser diode, as described relative to FIG. 1.

The tunnel junction 138 positioned between the two waveguides to enable current flow from the n-type cladding layer 137 in the waveguide into the p-type cladding layer 139 of the bottom waveguide. The tunnel junction 138 conducts current when reverse biased via tunneling. FIG. 4 depicts a blown-up view of the tunnel junction 138 with the n-type cladding layer 137 and the p-type cladding layer 139. As can be seen, the tunnel junction 138 may be formed from a very thin, heavily doped n++ layer 138a and an adjacent, very thin heavily doped p++ layer 138b. The two thin, heavily doped layers 138a, 138b are positioned in contact with one another and may each have a thickness of approximate 10-40 nm.

Since the two waveguides of the laser diode apparatus 100 are connected in series, the emitted optical power may be nearly twice that from a single emitter. The voltage drop across two waveguides will be approximately twice that of a single emitter. It is noted that additional waveguides and tunnel junctions can also be used to form a single emitter with multiple waveguides and tunnel junctions.

Figure 5:
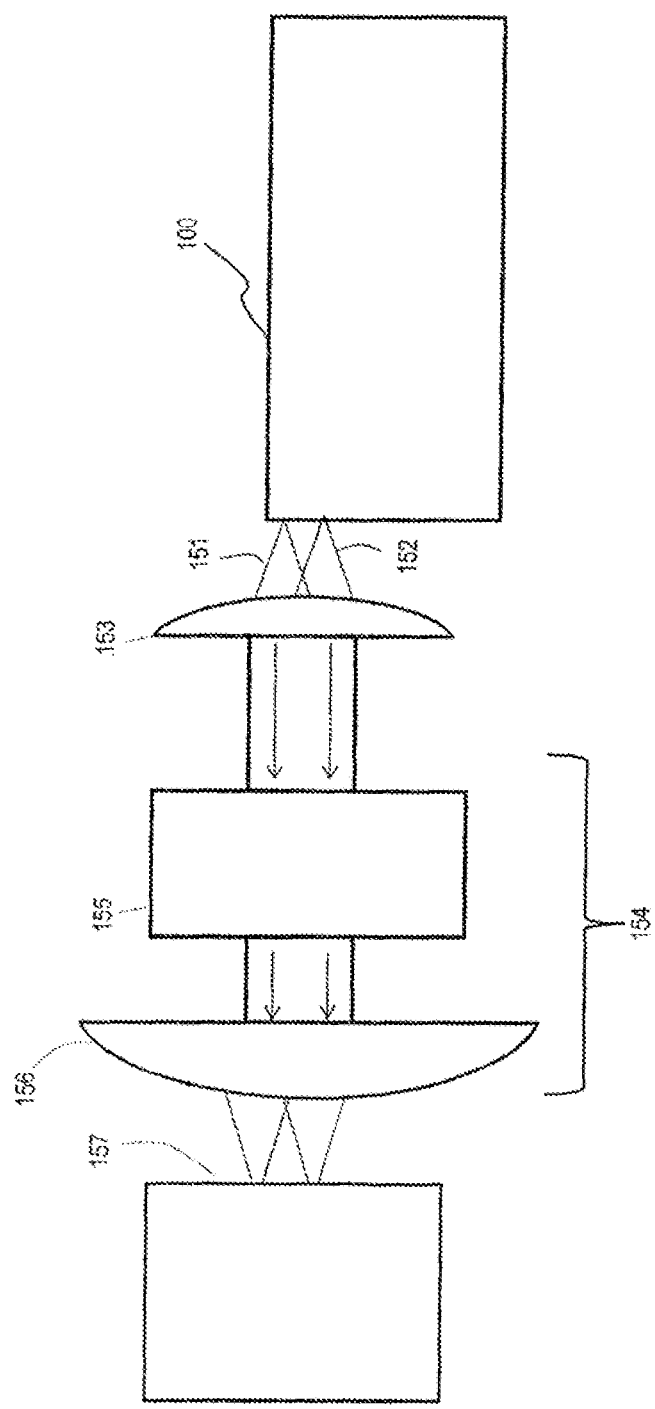
FIG. 5 is a schematic diagram of a coupled laser diode apparatus in use with optical components, in accordance with the first exemplary embodiment of the present disclosure.

One benefit of the laser diode apparatus 100 is that the two waveguides are positioned closer to each other than would be possible if each were grown on a separate wafer, which allows common optical components to be used to couple optical power from both diodes into an optical fiber, thereby reducing assembly effort and part cost. FIG. 5 is a schematic diagram of a laser diode apparatus 100 in use with optical components, in accordance with the first exemplary embodiment of the present disclosure. In particular, FIG. 5 illustrates optical components for a single emitter or for a bar consisting of multiple emitters stacked vertically in the same epitaxial structure. As shown, the laser diode apparatus 100 emits laser beams 151, 152 into a first collimator 153, which may be a single fast-axis collimator. Two laser beams 151, 152 are depicted, corresponding to a laser diode apparatus 100 with two waveguides or diodes, but additional laser beams could be emitted with additional waveguides or diodes, as may vary by design. The first collimator 153 may be positioned in an output path of the laser beams 151, 152 emitted by the waveguides, such that the laser beams 151, 152 can be collimated using only a single collimator 153. In contrast to conventional coupled diode arrays, which have a larger spaced distance between waveguides and therefore require multiple collimators or other optical devices to process the laser beams emitted from the waveguides, the laser diode apparatus 100 of the subject disclosure may use only a single collimator 153 to initially collimate the laser beams 151, 152.

The optical output of the first collimator 153 may be emitted into an optical fiber 157 which can direct the optical energy to any desired location. It is possible to further refine the optical output of the first collimator 153 using a corrective optics assembly 154, which may include a variety of optical components. When used, the corrective optical assembly 154 may be positioned between the single collimator 153 and the optical fiber 157 and receive the optical output of the single collimator 153, process the optical energy, and output it to the optical fiber 157. The corrective optics assembly 154 may include, for example, an additional collimator 155, such as a slow-axis collimator, among other corrective optical devices. The output of the additional collimator 155 may be directed to a focusing lens 156. Additional corrective devices may be inserted between the slow-axis collimator 155 and a focusing lens 156 but are not shown in FIG. 5 for the sake of clarity in illustration. The corrected, collimated beam is then focused into the optical fiber 157 with the focusing lens 156. One advantage of this design is that fewer components are required to couple twice the optical power into a fiber. The advantages apply to any emitter or bar that can use common slow-axis optics.

Figure 6:
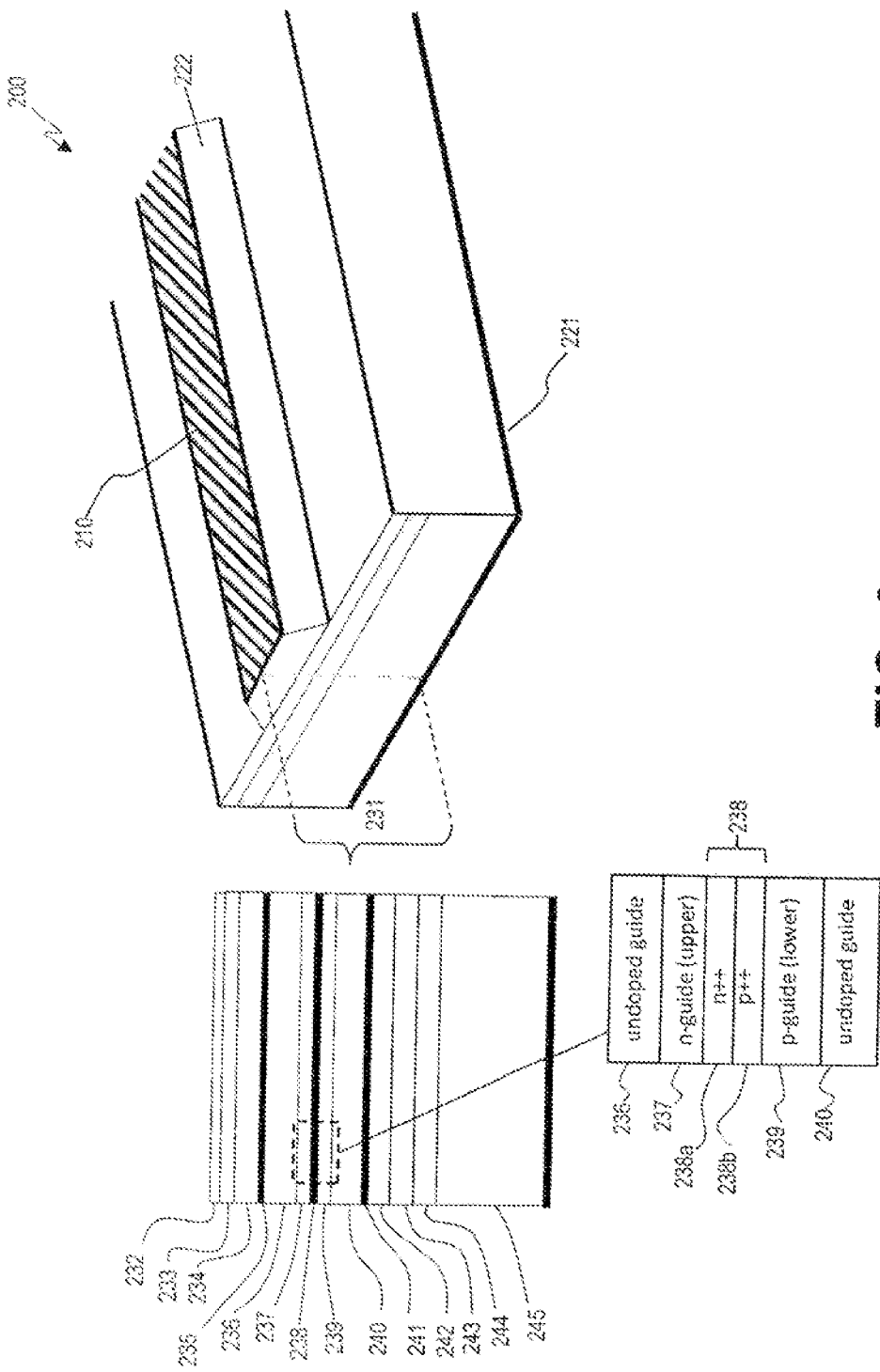
FIG. 6 is a schematic diagram of a fiber-coupled laser diode device, in accordance with a second exemplary embodiment of the present disclosure.

FIG. 6 is a schematic diagram of a fiber-coupled laser diode device 200, in accordance with a second exemplary embodiment of the present disclosure. Specifically, FIG. 6 illustrates an isometric view and corresponding cross-sectional view diagrams of the fiber-coupled laser diode device 200 having two guide layers with respective gain (active) layers 235, 241 connected in a single epitaxial structure 231 with a tunnel junction 238 sandwiched between the two active layers 235, 241 in a single waveguide. The fiber-coupled laser diode device 200 may be similar to the laser diode apparatus 100 descried relative to FIG. 4 and may include any of the components and functionality described relative to FIGS. 4-5.

As shown in FIG. 6, the fiber-coupled laser diode device 200 has one waveguide characterized as a single emitter formed from two laser diode structures, e.g., top and bottom diodes, each having active layers 235, 241 and guiding layers, respectively. The top diode structure includes a heavily doped p-type cap layer 232, a p-type clad layer 233 for the top diode, a top waveguide layer 234 for the top diode, a top active region or layer 235 where optical gain occurs, a bottom guide layer 236 in the top laser diode, and a bottom n-type guide layer 237 for the top laser diode. The other laser diode structure, i.e., the bottom diode includes a p-type guide layer 239 for the bottom diode, the top guide layer 240 for the bottom diode, a bottom active region or layer 241 for optical gain, a bottom guide layer 242 for the bottom diode, a bottom n-type cladding layer 243 for the bottom diode.

The fiber-coupled laser diode structure shown in FIG. 6 is similar to the uncoupled waveguides of the epitaxial structure in FIG. 4 with some important modifications. The lower cladding layer 137 of the upper laser diode and the upper cladding layer 139 of the lower laser diode of FIG. 4 are replaced with a bottom n-type guide layer 237 and a p-type guide layer 239 for the bottom emitter, each of which is formed from a material having similar or even slightly larger optical refractive index than the guiding layers adjacent to the active layer for each waveguide, i.e., the bottom guide layer 236 and the top guide layer 240, respectively.

As shown, the tunnel junction 238 is positioned between the top and bottom diodes, such that it is in contact with the bottom n-type guide layer 237 of the top laser diode and the p-type guide layer 239 of the bottom laser diode. The fiber-coupled laser diode device 200 also includes a buffer layer 244 and the substrate 245. The substrate 244, the bottom contact 221, the top contact 210, and the ridge 222 may be similar to as described in FIG. 4. The tunnel junction 238 positioned between the two laser diodes enables current flow from the n-type guide layer 237 in the top laser diode into the p-type guide layer 239 of the bottom laser diode. FIG. 6 depicts a blown-up view of the tunnel junction 238 with the n-type guide layer 237 and the p-type guide layer 239. As can be seen, the tunnel junction 238 may be formed from a very thin, heavily doped n++ layer 238a and an adjacent, very thin heavily doped p++ layer 238b. The two thin, heavily doped layers 238a, 238b are positioned in contact with one another and may each have a thickness of approximate 10-40 nm.

This embodiment of the fiber-coupled laser diode device 200 achieves increased brightness while decreasing the fast-axis divergence. Increased brightness is due, at least in part, to the fact that the waveguides are fiber-coupled, such that they lase coherently. The slower fast-axis divergence places less stringent restrictions on the fast-axis collimator while the increased brightness results in nearly twice the fiber coupled power for a given optical fiber numerical aperture and laser diode drive current. In this embodiment, the two active layers 235, 241 may share a common vertical waveguide and operate coherently, meaning that stimulated emission from both active layers 235, 241 results in increased optical power in a single vertical optical mode. It is noted that it may be important to select the layer thicknesses and material compositions to achieve the desired laser performance. For example, very high power may be achieved using a longer cavity. In this case, some waveguide loss may be acceptable to improve the brightness by moving the active layers further apart. The greater separation between active layers reduces modal gain resulting in higher threshold current, but the vertical mode will be broader which mitigates asymmetry thereby improving fiber coupling efficiency.

Figure 7:
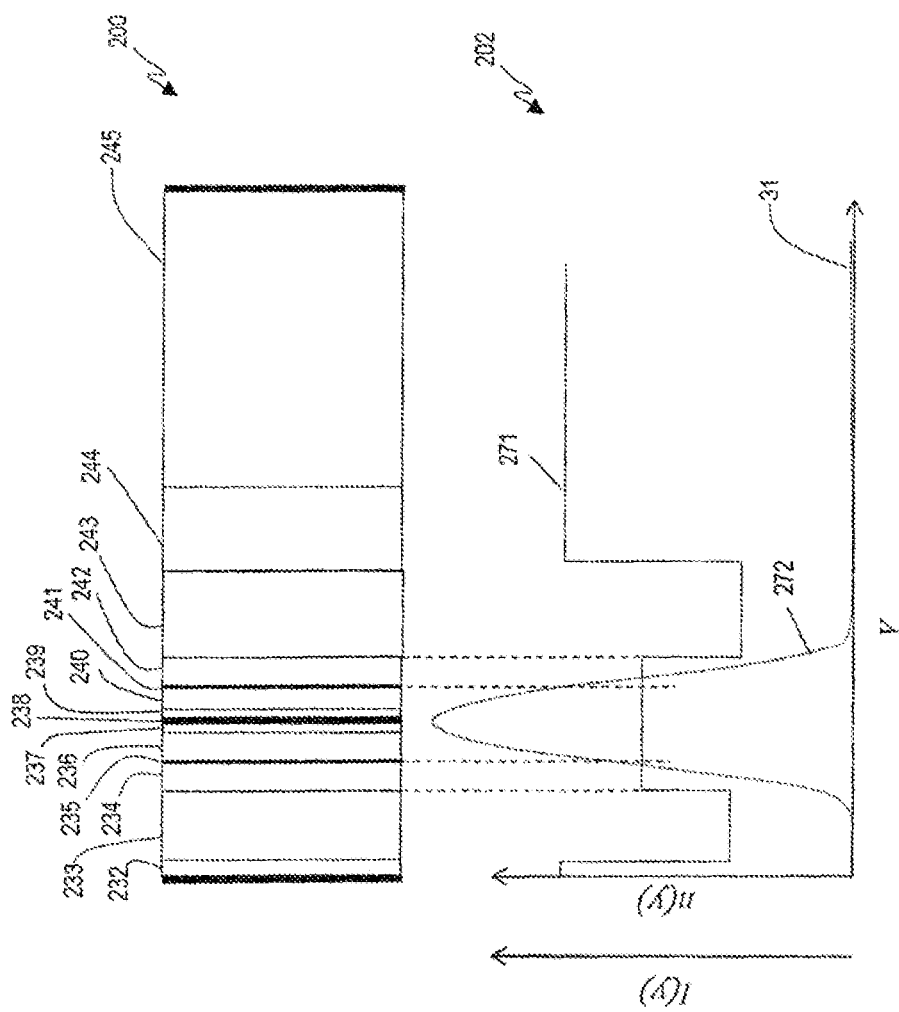
FIG. 7 is a schematic diagram of the fiber-coupled laser diode device of FIG. 6 and corresponding refractive index and optical intensity graph, in accordance with the second exemplary embodiment of the subject disclosure.

FIG. 7 is a schematic diagram of the fiber-coupled laser diode device 200 of FIG. 6 and corresponding refractive index and optical intensity graph 202, in accordance with the second exemplary embodiment of the subject disclosure. Relative to FIGS. 6-7, the refractive index profile 271 and fast-axis near-field intensity 272 are shown for the coherent tunnel junction edge emitting laser diode 200 along the growth direction 31. FIG. 7 also shows the active layers 235, 241 as two quantum well active layers in the diodes. These quantum well active layers 235, 241 may be comprised of one or more quantum wells. The tunnel junction 238 is located in the middle of the two diodes.

Numerous characteristics depicted in FIG. 7 may differ from those of a conventional edge emitting laser diode, thus showing some of the benefits of the subject disclosure. For example, the active layers 235, 241 are not located at the same position as the peak intensity of the optical mode 272 as would conventionally be done. Additionally, heavily doped layers required to create the tunnel junction 237, 238, and 239 are located in the middle of the waveguide. Consequently, optical loss due to free carrier absorption may be higher than that of a conventional laser diode and the modal gain is much less than would be achieved if the gain of the active layer were aligned with the peak optical intensity. Consequently, greater electrical current is required to cause laser emission. In other words, the threshold current for a given contact area and cavity length is increased. These disadvantages may be more than compensated by the increased brightness at high drive currents that result from higher slope efficiency, coherent lasing from serially connected p-n junctions along with improved optical beam parameter. The latter is possible because the two active regions 235, 241 may be separated by more than a micron. Care must be taken in the design of the layer properties and thickness to insure that the lowest order vertical optical mode has higher gain than other propagating vertical modes so the fundamental vertical mode is preferentially selected when lasing commences.

Figure 2:
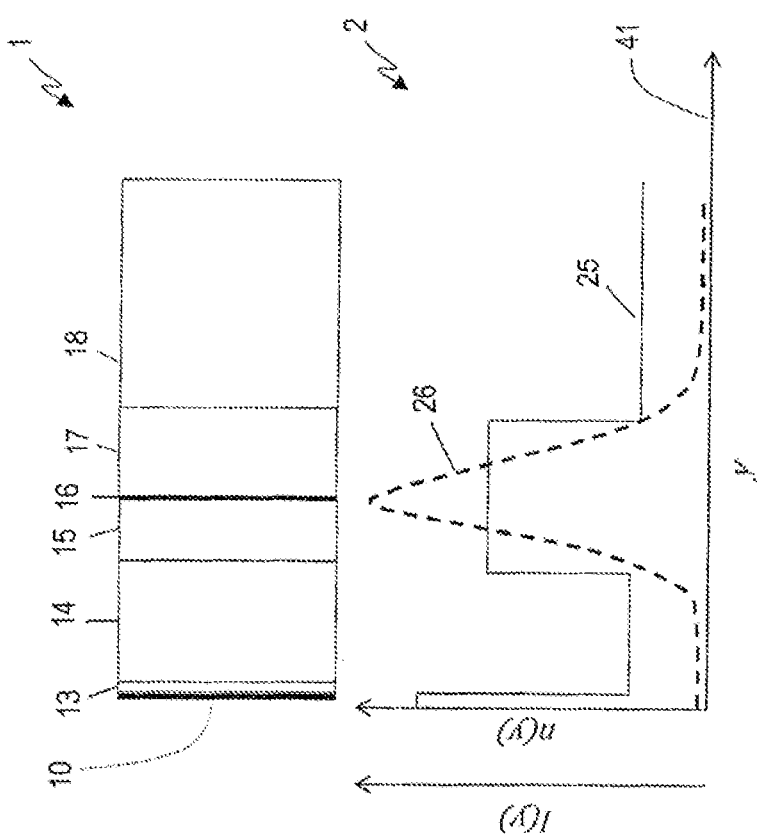
FIG. 2 is a schematic diagram of the edge emitting laser diode of FIG. 1 and corresponding refractive index and optical intensity graph, in accordance with the prior art.
Figure 3:
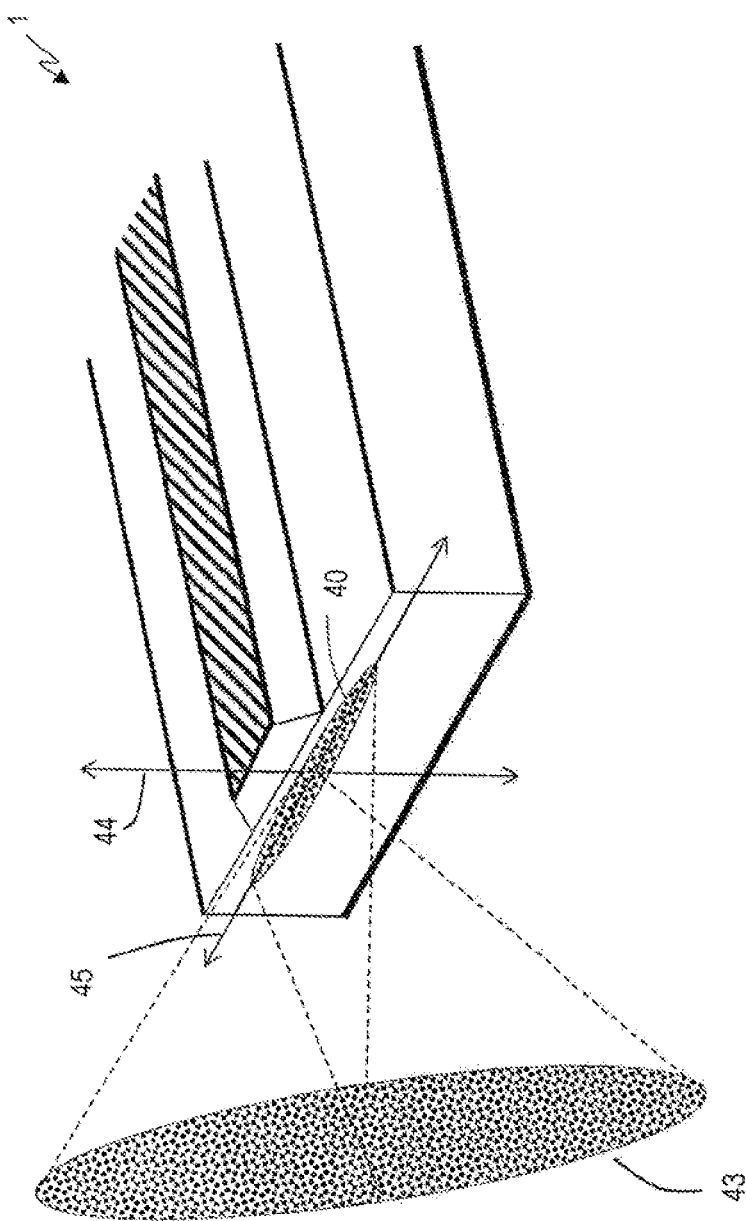
FIG. 3 is a schematic diagram of the edge emitting laser diode of FIG. 1 showing the optical intensity of the laser diode at the laser facet, in accordance with the prior art.
Figure 8:
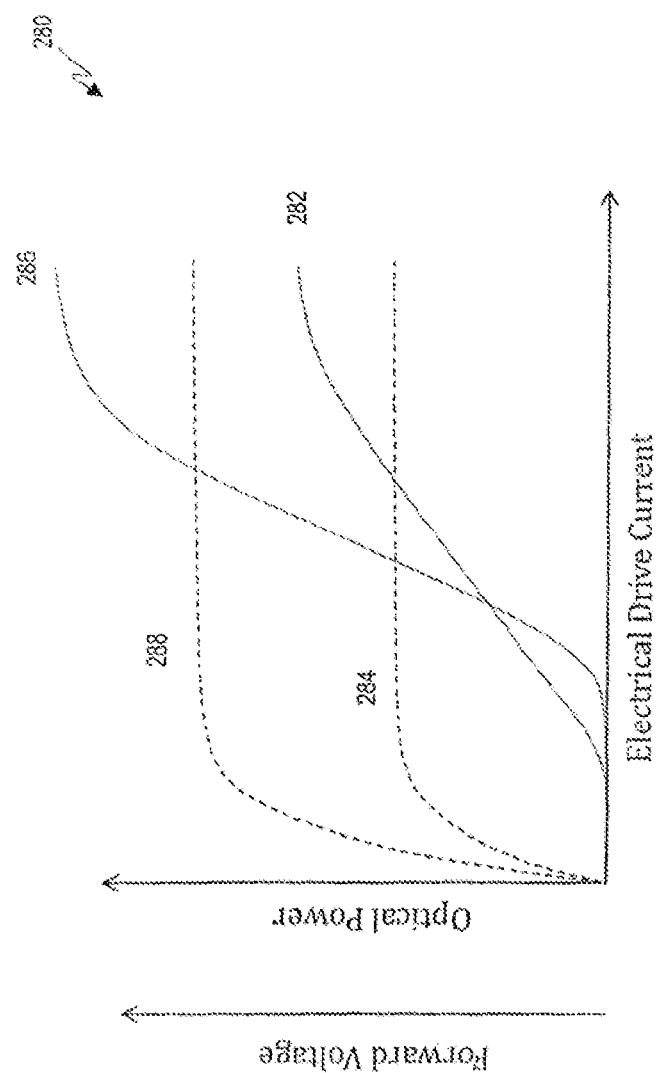
FIG. 8 is a graph of the optical power relative to drive current of conventional laser diodes and the fiber-coupled laser diode device of FIG. 6, in accordance with the second exemplary embodiment of the subject disclosure.

FIG. 8 is a graph 280 of the optical power relative to drive current of conventional laser diodes and the fiber-coupled laser diode device 200 of FIG. 6, in accordance with the second exemplary embodiment of the subject disclosure. In the graph 280 of FIG. 8, a representative curve depicts the output power 282 of a conventional edge-emitting laser diode, such as that depicted in FIGS. 1-2. The corresponding voltage 284 is also shown. The output power 286 and voltage 288 of the fiber-coupled laser diode device of FIG. 6 are also depicted in FIG. 8. As can be seen in FIGS. 6-8, the forward voltage drop 288 across the fiber-coupled laser diode device 200 is approximately twice the voltage 284 of a conventional single junction emitter. Also, the threshold current of the fiber-coupled laser diode device 200 is higher than that of the conventional laser diode for the reasons discussed so far. With regard to total electrical to optical conversion efficiency, the fiber-coupled laser diode device 200 may not exceed that of a conventional laser diode. However, because the emission is coherent, the brightness from the fiber-coupled laser diode device 200 will be significantly higher, enabling increased total power that can be coupled to a multimode fiber. Similar to the first embodiment, restrictions on optical components are also relaxed because higher power at lower divergence is emitted in a smaller area than two equivalent stacked lasers or laser bars.

Figure 9:
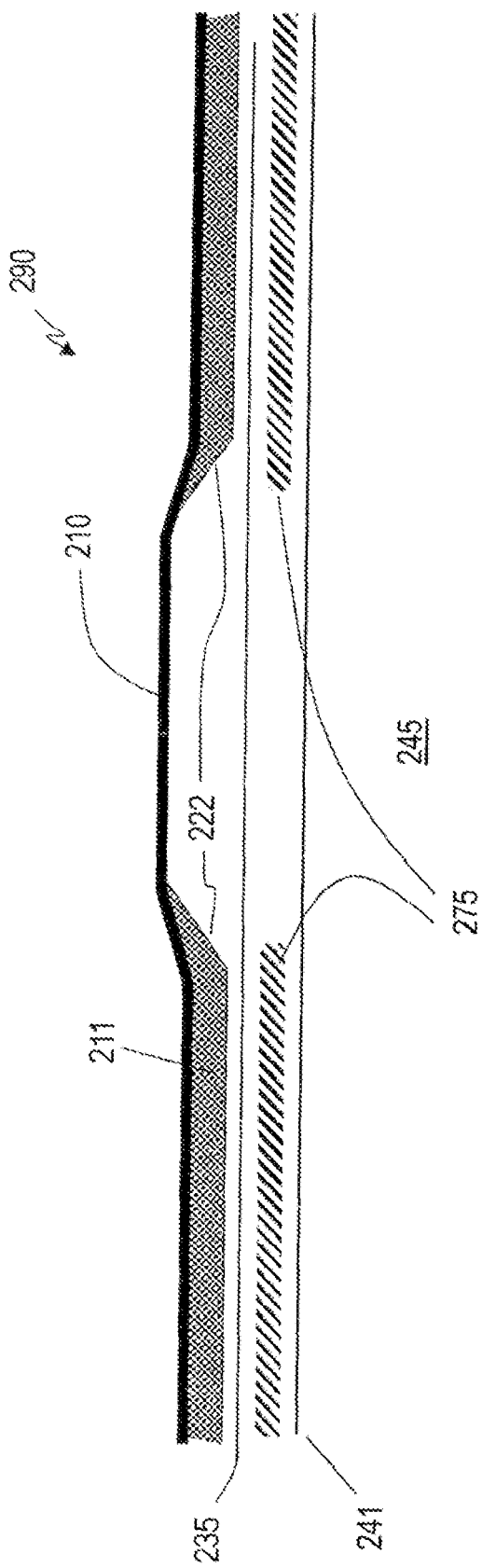
FIG. 9 is a schematic diagram of the fiber-coupled laser diode of FIG. 6, in which dopants are passivated to restrict lateral current flow, in accordance with a third exemplary embodiment of the subject disclosure.

FIG. 9 is a schematic diagram 290 of the fiber-coupled laser diode of FIG. 6, in which dopants are passivated to restrict lateral current flow, in accordance with a third exemplary embodiment of the subject disclosure. Specifically, as shown in FIG. 9, ions 275 have been implanted to passivate dopants outside the lateral in the heavily doped regions of the tunnel junction, between the active layers 235, 241 of the first and second guiding layers discussed relative to FIGS. 6-7. The implanted ions deactivate dopant impurities leading to increased local resistivity. Lateral current confinement reduces optical loss due to mismatch between the lateral gain profile of the upper and lower quantum wells. Accordingly, ion implantation can be used to improve overall gain and lateral (slow-axis) beam quality by restricting lateral current flow, which serves to match the lateral gain profile of the bottom active region 241 to that of the upper active region 235. This matching of the lateral gain profile reduces optical loss due to the mismatch between the gain profile and lateral optical mode(s). Ion implantation may be achieved by any known methods used in the industry. FIG. 9 further depicts the lateral waveguide which is comprised of the laser ridge 222 and oxide passivation 211. The metal p-type contact may form an Ohmic contact to the top p-type semiconductor in the ridge 222. As shown, ion implantation may be specifically directed to specific portions of the waveguide, including to those laterally outside of the laser ridge 222, such that ion implantation is not included directly under the top contact 210 and between the edges of the laser ridge 222.

Figure 10:
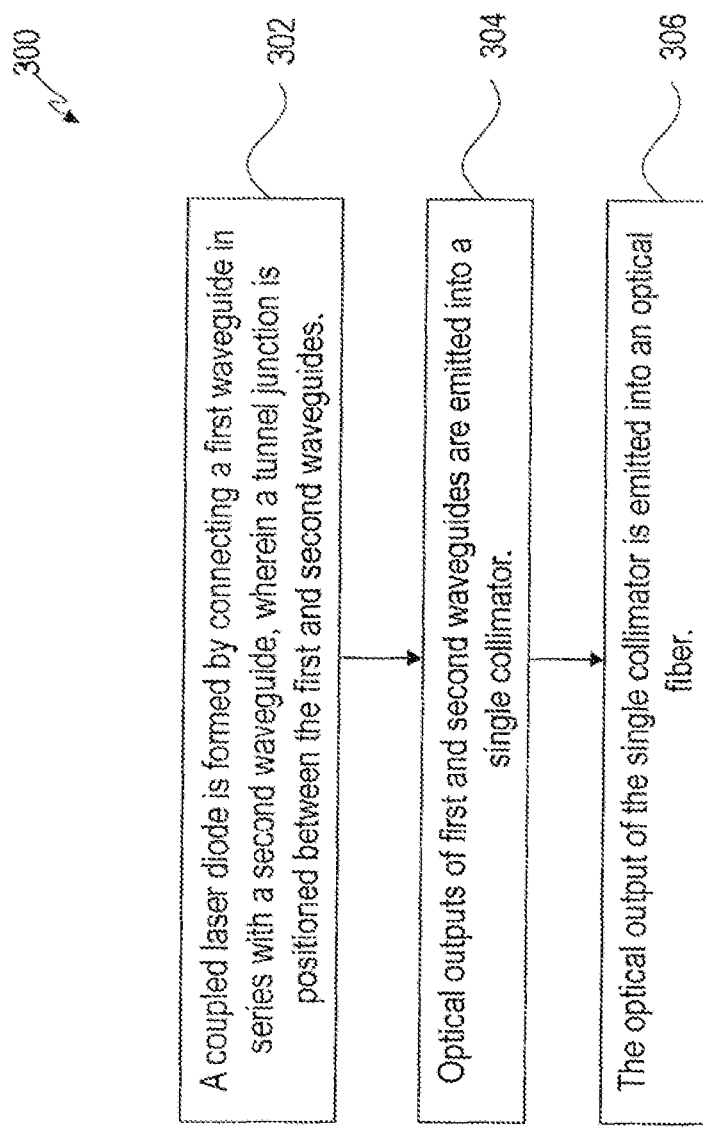
FIG. 10 is a flowchart illustrating a method of coupling optical outputs from edge-emitting laser diodes into an optical fiber, in accordance with a fourth exemplary embodiment of the disclosure.

FIG. 10 is a flowchart 300 illustrating a method of coupling optical outputs from edge-emitting laser diodes into an optical fiber, in accordance with a fourth exemplary embodiment of the disclosure. It should be noted that any process descriptions or blocks in flow charts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

As is shown by block 302, a coupled laser diode is formed by connecting a first guiding layer to a second guiding layer in a single epitaxial structure, wherein a tunnel junction is positioned between the first and second guiding layers. Optical outputs of first and second guiding layers are emitted into a single collimator (block 304). The optical output of the single collimator is emitted into an optical fiber (block 306).

The method may further include a number of additional steps, which may include any of the steps, structures, or functionality disclosed relative to FIGS. 4-9 or FIG. 11. For example, the optical output from the single collimator may be corrected with a corrective optical assembly positioned between the single collimator and the optical fiber, wherein the corrective optical assembly includes a second collimator, a corrective optic device, and a focusing lens. The tunnel junction may be formed between the first and second guiding layers from two thin, heavily doped layers positioned in contact with one another. The active layers of the first and second guiding layers may share a common vertical waveguide formed from the first guiding layer in contact with one of the two thin, heavily doped layers and the second guiding layer positioned in contact with another of the two thin, heavily doped layers. The first guiding layer may include an undoped guide layer and a n-guide layer positioned adjacent to the n++ layer, wherein the n-guide layer contacts the n++ layer, and wherein the second guiding layer further comprises an undoped guide layer and a p-guide layer, wherein the p-guide layer contacts the p++ layer. The n-guide layer and the p-guide layer of the first and second guiding layers, respectively, may have an optical refractive index equal to or greater than an optical refractive index of the undoped guide layers of the first and second guiding layers.

Figure 11:
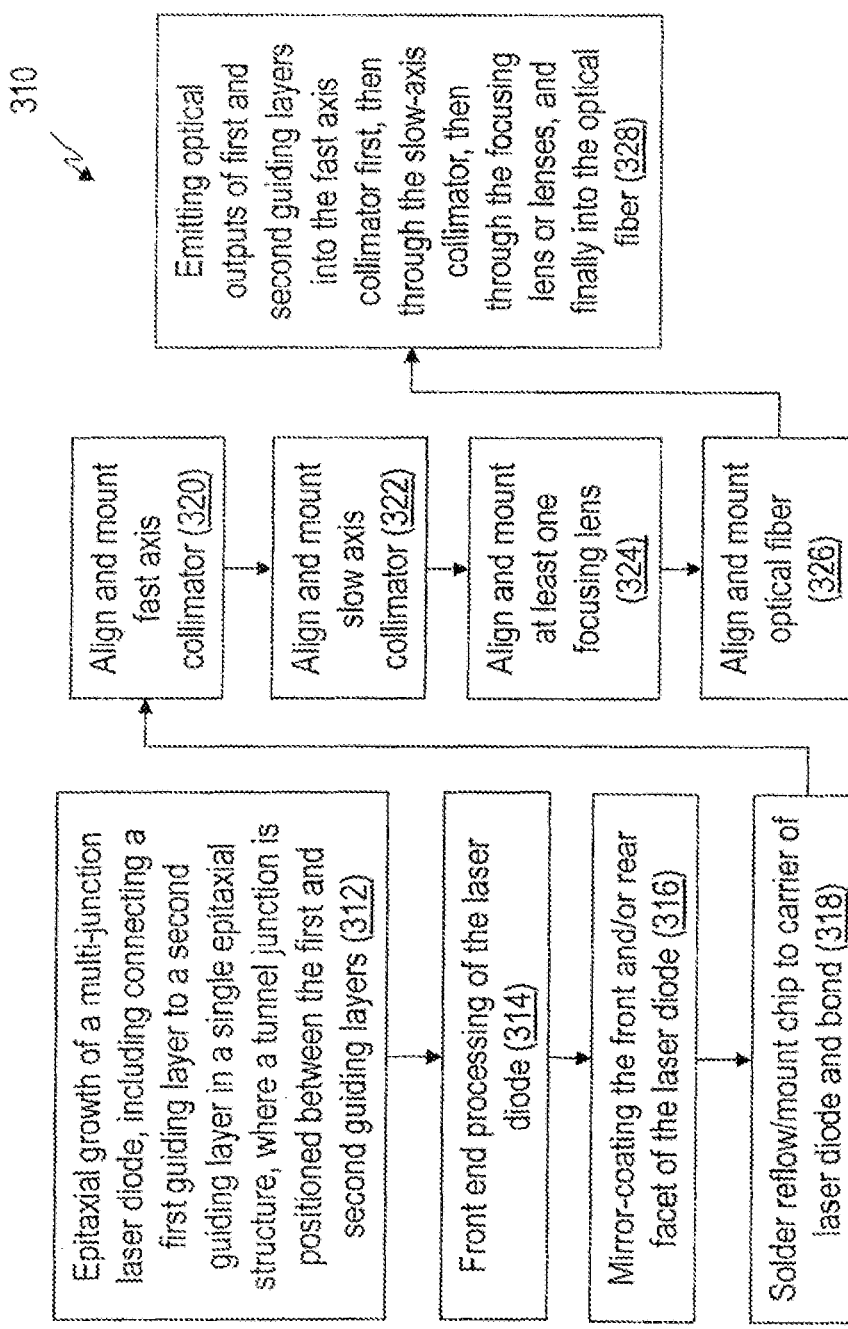
FIG. 11 is a flowchart illustrating a method of coupling optical outputs from edge-emitting laser diodes into an optical fiber, in accordance with the fourth exemplary embodiment of the disclosure.

FIG. 11 is a flowchart 310 illustrating a method of coupling optical outputs from edge-emitting laser diodes into an optical fiber, in accordance with the fourth exemplary embodiment of the disclosure. It should be noted that any process descriptions or blocks in flow charts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

The method of FIG. 11 provides additional details to the method of FIG. 10. For instance, in FIG. 11, the method may begin with epitaxial growth of a multi junction laser diode, which includes connecting a first guiding layer to a second guiding layer in a single epitaxial structure, where a tunnel junction is positioned between the first and second guiding layers (block 312). The multi junction laser diode may then be subjected to front end processing (block 314), such as etching, photolithography, or a similar processing technique. The front and/or rear facet of the laser diode may be mirror-coated (block 316). A chip is solder reflowed and mounted to the carrier and bonded thereto (block 318). A fast axis collimator is aligned and mounted (block 320) and a slow axis collimator is aligned and mounted (block 322). A focusing lens, or a plurality of focusing lenses, are aligned and mounted (block 324). The optical fiber is aligned and mounted (block 326). Then, the optical outputs of first and second guiding layers are emitted into the fast axis collimator first, then through the slow-axis collimator, then through the focusing lens or lenses, and finally into the optical fiber (block 328).

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A fiber-coupled laser diode device comprising:
a first guiding layer connected to a second guiding layer in a single epitaxial structure, each of the first and second guiding layers having an active layer;
a tunnel junction positioned between the first and second guiding layers, the tunnel junction formed from two thin, heavily doped layers positioned in contact with one another; and
a common vertical waveguide shared by the active layers of the first and second guiding layers, the common vertical waveguide formed from the first guiding layer in contact with one of the two thin, heavily doped layers and the second guiding layer positioned in contact with another of the two thin, heavily doped layers.

2. The fiber-coupled laser diode device of claim 1, wherein the active layer of each of the first and second guiding layers further comprises a quantum well active layer.

3. The fiber-coupled laser diode device of claim 2, wherein the two thin, heavily doped layers of the tunnel junction further comprises a n++ layer and a p++ layer, wherein the first guiding layer is a n-guide layer and the second guiding layer is a p-guide layer.

4. The fiber-coupled laser diode device of claim 3, wherein the first guiding layer further comprises an undoped guide layer and a n-guide layer positioned adjacent to the n++ layer, wherein the n-guide layer contacts the n++ layer, and wherein the second guiding layer further comprises an undoped guide layer and a p-guide layer, wherein the p-guide layer contacts the p++ layer.

5. The fiber-coupled laser diode apparatus of device 4, wherein the n-guide layer and the p-guide layer of the first and second guiding layers, respectively, have an optical refractive index equal to or greater than an optical refractive index of the undoped guide layers of the first and second guiding layers.

6. A method of coupling optical outputs from edge-emitting laser diodes into an optical fiber, the method comprising: forming a fiber-coupled laser diode device by connecting a first guiding layer to a second guiding layer in a single epitaxial structure, wherein a tunnel junction is positioned between the first and second guiding layers; emitting optical outputs of first and second guiding layers into a single collimator; and emitting the optical output from the single collimator into an optical fiber; and further comprising forming the tunnel junction between the first and second guiding layers from two thin, heavily doped layers positioned in contact with one another;

wherein active layers of the first and second guiding layers share a common vertical waveguide formed from the first guiding layer in contact with one of the two thin, heavily doped layers and the second guiding layer positioned in contact with another of the two thin, heavily doped layers.

7. The method of claim 6, further comprising correcting the optical output of the single collimator with a corrective optical assembly positioned between the single collimator and the optical fiber, wherein the corrective optical assembly comprises:

a second collimator;

a corrective optic device; and a focusing lens.

8. The method of claim 6, further comprising matching a lateral gain profile of the active layers to a gain profile of a lateral waveguide by implanting ions on either side of the lateral waveguide at a depth proximate to the tunnel junction.

9. The method of claim 6, wherein the first guiding layer further comprises an undoped guide layer and a n-guide layer positioned adjacent to the n++ layer, wherein the n-guide layer contacts the n++ layer, and wherein the second guiding layer further comprises an undoped guide layer and a p-guide layer, wherein the p-guide layer contacts the p++ layer.

* * * * *